(12) United States Patent
Loinaz et al.

(10) Patent No.: US 6,377,082 B1
(45) Date of Patent: Apr. 23, 2002

(54) LOSS-OF-SIGNAL DETECTOR FOR CLOCK/ DATA RECOVERY CIRCUITS

(75) Inventors: Marc J. Loinaz, Westfield, NJ (US); Gary D. Polhemus, Sebago, ME (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/641,158

(22) Filed: Aug. 17, 2000

(51) Int. Cl.[7] ............................................... H03K 5/22
(52) U.S. Cl. ........................... 327/20; 327/24; 327/156
(58) Field of Search ............................ 327/20, 50, 58, 327/72, 63, 24, 62, 156; 324/207.2

(56) References Cited

U.S. PATENT DOCUMENTS

| | | | |
|---|---|---|---|
| 5,138,636 A | * 8/1992 | Bardin | 327/20 |
| 5,563,893 A | 10/1996 | Lai | 371/6 |
| 6,064,199 A | * 5/2000 | Walter et al. | 324/207.2 |

OTHER PUBLICATIONS

"Decision–point steering in optical fibre communication systems: theory", by M. Sherif and P.A. Davies, IEE Proceedings, vol. 136, Pt. J, No. 3, Jun. 1989, pp. 169–176.

"Frequency Detectors for PLL Acquisition in Timing and Carrier Recovery", by David G. Messerschmitt, IEEE Trans. Comm., vol. COM–27, Sep. 1979, pp. 107–114.

\* cited by examiner

*Primary Examiner*—Dinh T. Le
(74) *Attorney, Agent, or Firm*—Steve Mendelsohn

(57) ABSTRACT

A loss-of-signal (LOS) detector, for example, for a clock/data recovery (CDR) circuit for an optical fiber communication system, has (1) a transition detector for detecting stuck-on-one and stuck-on-zero LOS conditions and (2) an inconsistency detector for detecting other types of LOS conditions. In one embodiment, the inconsistency detector has two decision circuits having different operating conditions (e.g., different decision thresholds and/or different sampling times). The two decision circuits are configured to generate like output signals (i.e., both high or both low), when a valid input data signal is applied. However, at certain times during certain LOS conditions, the outputs of the two decision circuits will be mutually inconsistent (i.e., one high and one low). If the number of such inconsistencies over a specified time period exceeds a specified threshold level, then an LOS condition is determined. As a result, the inconsistency detector enables the LOS detector to quickly detect LOS conditions that are not reliably detected by prior art LOS detectors, including those associated with high-amplitude, randomly switching input data signals, providing more robust and conclusive detection of cut fiber conditions.

24 Claims, 5 Drawing Sheets

LOSS-OF-SIGNAL DETECTOR FOR CLOCK/DATA RECOVERY CIRCUITS

BACKGROUND OF THE INVENTION

1. Field of the Invention

The present invention relates to communications, and, in particular, to circuitry for detecting a loss of signal during communications over, for example, optical fibers.

2. Description of the Related Art

Figure 1:
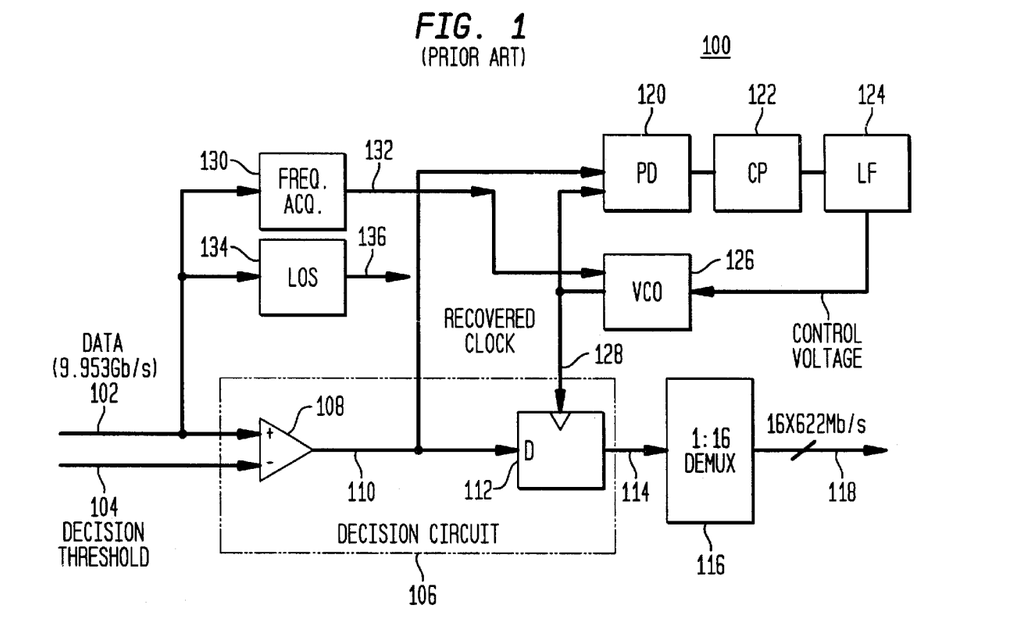
FIG. 1 shows a block diagram of a conventional clock/data recovery (CDR) circuit suitable for applications such as 9.953-Gb/s fiber optic communications.

FIG. 1 shows a block diagram of a conventional clock/data recovery (CDR) circuit 100 suitable for applications such as 9.953-Gb/s fiber optic communications. CDR circuit 100 employs a phase-locked loop (PLL) that extracts a 9.953-GHz clock from an NRZ (non-return-to-zero) input data signal and recovers the data using this recovered clock. In this particular example, the recovered data is then de-multiplexed into a 16-bit parallel stream with each of the 16 outputs having a data rate of 622 Mb/s.

In particular, comparator 108 (e.g., a differential amplifier) of decision circuit 106 receives input data signal 102 and a stable decision threshold signal 104 (typically set to the midpoint between logic "0" and logic "1" voltage levels) and generates a difference signal 110 based on the difference between the input data signal and the decision threshold signal. Difference signal 110 is then input to a conventional charge-pump PLL consisting of phase detector (PD) 120, charge pump (CP) 122, loop filter (LF) 124, and voltage-controlled oscillator (VCO) 126. The PLL generates the 9.953-GHz recovered clock signal 128, which is used to trigger a flip-flop 112 in decision circuit 106 that samples difference signal 110 to generate a 9.953-Gb/s recovered data signal 114, which is then de-multiplexed by 1:16 demux 116 into 16-bit parallel recovered data stream 118. Frequency acquisition circuit 130 uses input data signal 102 to generate estimated frequency 132, a rough estimate of the frequency of the input data signal that is used to tune VCO 126 to the appropriate frequency range.

One of the challenges in implementing a CDR circuit, such as CDR circuit 100 of FIG. 1, is the problem of detecting when the input data signal no longer contains valid data. For example, in optical fiber communications, it is desirable to be able to detect the loss of signal that results when the fiber to the photo-diode (which converts the received optical signal into electrical input data signal 102 and which is not shown in FIG. 1) is cut, which may result in one of the following input signal conditions:

Input data switching randomly;
Input data switching synchronously with the local VCO (due to unintentional feedback); or
Input data stuck at logic "1" (referred to as a "stuck-at-one" condition) or stuck at logic "0" (referred to as a "stuck-at-zero" condition). To address the possibility of these different conditions, conventional CDR circuits are implemented with a loss-of-signal (LOS) detector that is designed to detect different input signal conditions that can result from failures such as cut fibers. For example, conventional CDR circuit 100 of FIG. 1 comprises LOS detector 134, which processes input data signal 102 to generate LOS signal 136, which is sent off chip to indicate when an LOS condition has been detected (e.g., a logic "0" indicating a valid signal condition and a logic "1" indicating a detected LOS condition).

Figure 2:
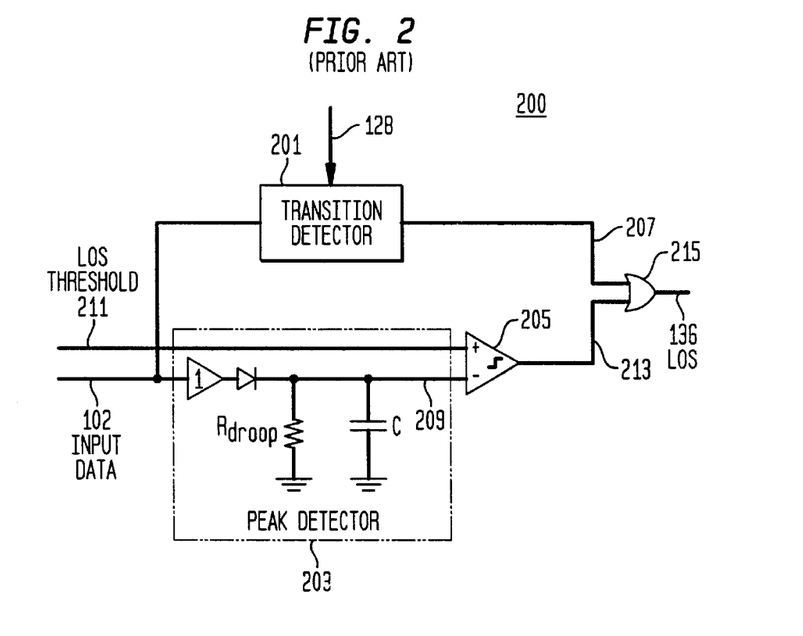
FIG. 2 shows a block diagram of a conventional LOS detector for use in the CDR circuit of FIG. 1.

FIG. 2 shows a block diagram of a conventional LOS detector 200 used in CDR circuits, such as for LOS detector 134 in CDR circuit 100 of FIG. 1. LOS detector 200 comprises two different circuits designed to detect different types of LOS conditions that may result from a cut fiber: a transition detector 201 for detecting stuck-at-one and stuck-at-zero conditions and an amplitude detection circuit (consisting of peak detector 203 and comparator 205) for detecting when the input data signal has too low a peak-to-peak amplitude.

Transition detector 201 detects a stuck-at-one or a stuck-at-zero condition that may result when a fiber is cut. Transition detector 201 is a logic circuit that samples the input data signal 102 using the recovered clock signal 128 and counts the number of 0-to-1 and 1-to-0 transitions that occur. Transition detector 201 generates a high (i.e., logic "1") output signal 207 if no transitions have occurred in a specified time period. Alternatively, transition detector 201 may produce a high output signal if less than K transitions are detected over a specified time period. Transition detector 201 may be implemented using either digital or mixed analog-digital circuit techniques.

The amplitude detection circuit of LOS detector 200 detects LOS situations in which the peak-to-peak amplitude of the input data signal remains below a certain level, such as may occur if the fiber is cut and the input data signal 102 is switching randomly with low peak-to-peak amplitude. The amplitude detection circuit will also detect LOS situations where the input data signal is switching synchronously with the VCO due to local feedback, where the crosstalk-induced data signal peak-to-peak amplitude is likely to be relatively low.

In particular, peak detector 203 estimates the peak value of input data signal 102. The resulting peak signal 209 is subtracted from a stable LOS threshold signal 211 by comparator 205 to generate an output signal 213, which is high (indicating an LOS signal) if peak signal 209 falls below LOS threshold signal 211. Under normal operating conditions in which the input data signal contains valid data, the NRZ input data signal will be present at sufficient peak-to-peak amplitude such that peak signal 209 generated by peak detector 203 will remain above LOS threshold signal 211.

Peak detector 203 is designed to have a leakage path through resistor $R_{droop}$ that provides "droop" (i.e., signal level decay). If the input data signal disappears or if its peak-to-peak amplitude does not reach a sufficiently high level with sufficient frequency, then peak signal 209 generated by peak detector 203 will slowly drop as a result of the leakage through resistor $R_{droop}$. When peak signal 209 falls below LOS threshold signal level 211, output signal 213 generated by comparator 205 will go high indicating an LOS condition.

Output signals 207 and 213 generated by transition detector 201 and comparator 205, respectively, are input to OR gate 213, which applies a logical "OR" operation to generate a high LOS signal 136, if either or both of output signals 207 and 213 are high, indicating that an LOS condition has been detected.

Although LOS detector 200 of FIG. 2 does a good job detecting certain LOS conditions, it does not provide reliable detection of an LOS condition in which the input data signal has a relatively large peak-to-peak amplitude and is switching randomly (i.e., not synchronously with the VCO). Such a situation could occur when a fiber cut occurs upstream of an optical amplifier, which would then be located between the fiber cut and the CDR circuit, where the optical amplifier contributes to generation of a noise-induced, randomly switching, large-amplitude input data signal. In another situation, crosstalk effects (asynchronous to the VCO) could produce large-amplitude noise. In each of these cases, since the input data signal will contain frequent zero crossings, transition detector 201 of LOS detector 200 will not detect an LOS condition. By the same token, since, in each of these cases, the input data signal will frequently achieve peak-to-peak amplitudes greater than LOS threshold 211, the amplitude detection circuit of LOS detector 200 will not detect an LOS condition.

SUMMARY OF THE INVENTION

The present invention is directed to loss-of-signal detectors that are designed to detect LOS conditions that are not reliably detected by conventional LOS detectors, such as LOS detector 200 of FIG. 2. In particular, in addition to the LOS conditions detected by such conventional LOS detectors, the LOS detectors of the present invention are designed to detect LOS conditions in which the input data signal has a relatively large peak-to-peak amplitude and is switching randomly (relative to the recovered clock signal). According to embodiments of the present invention, the LOS detector for a clock/data recovery circuit comprises a (e.g., conventional) transition detector (for detecting stuck-at-one and stuck-at-zero LOS conditions) and an inconsistency detector, based on (at least) two decision circuits having different operating conditions (e.g., different decision thresholds). The two decision circuits are configured to generate like output signals (i.e., both high or both low), when a valid input data signal is applied. However, at certain times during certain LOS conditions, the outputs of the two decision circuits will be mutually inconsistent (i.e., one high and one low). These occurrences of inconsistency are added up and, if the number of inconsistencies over a specified time period exceeds a specified threshold level, then an LOS condition is detected. As a result, the inconsistency detector enables the LOS detector to quickly detect LOS conditions that are not reliably detected by prior art LOS detectors, including those associated with high-amplitude, randomly switching input data signals, providing more robust and conclusive detection of cut fiber conditions.

In one embodiment, the present invention is an LOS detector for a clock/data recovery (CDR) circuit configured to (1) generate a recovered clock signal from an input data signal, (2) sample the input data signal with a CDR decision circuit based on the recovered clock signal, and (3) compare the sampled input data signal to a CDR decision threshold to generate a recovered data signal, the LOS detector comprising (a) a transition detector configured to detect a stuck-at-one or a stuck-at-zero LOS condition in the input data signal; and (b) an inconsistency detector configured to detect an LOS condition in which the input data signal switches asynchronously with respect to the recovered clock signal, wherein the inconsistency detector operates independent of any measure of peak-to-peak amplitude of the input data signal.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 3:
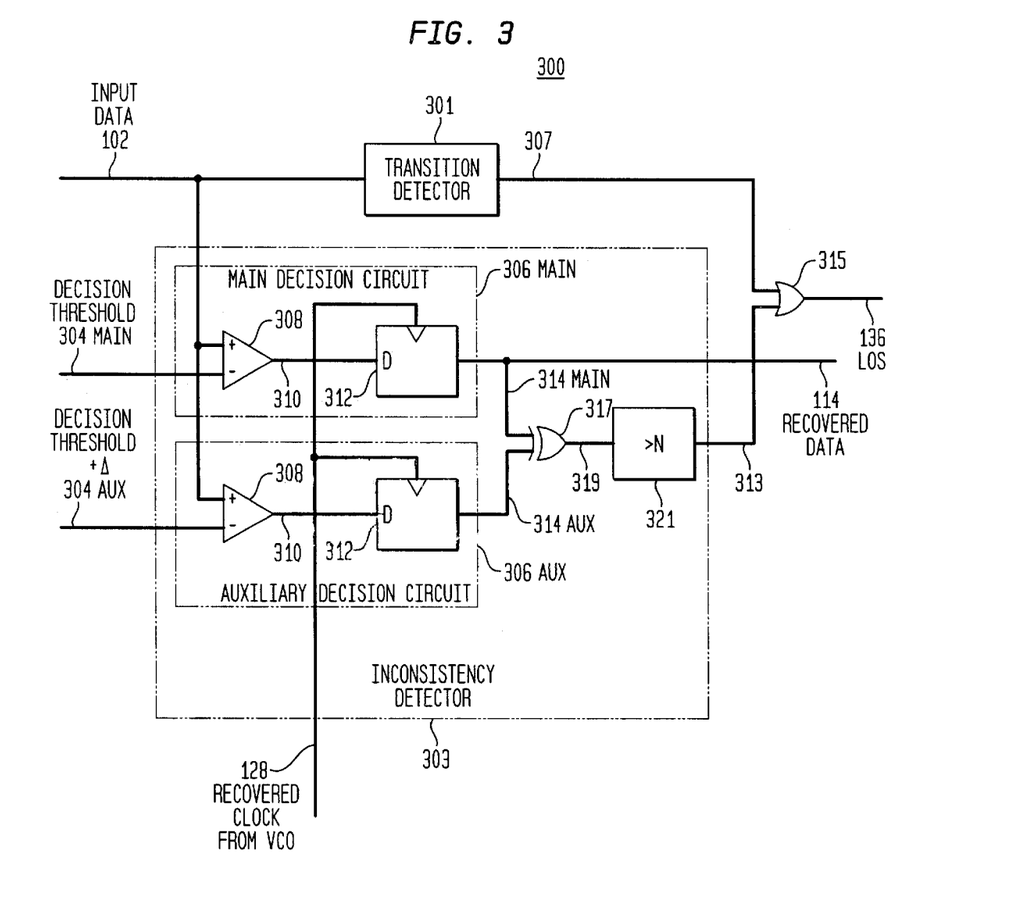
FIG. 3 shows a block diagram of an LOS detector, according to one embodiment of the present invention, for use in the CDR circuit of FIG. 1.

FIG. 3 shows a block diagram of a loss-of-signal detector 300, according to one embodiment of the present invention. LOS detector 300 can be used in clock/data recovery circuits, such as for LOS detector 134 in CDR circuit 100 of FIG. 1. Like LOS detector 200 of FIG. 2, LOS detector 300 comprises a transition detector 301 (for detecting stuck-at-one and stuck-at-zero LOS conditions) and an OR gate 315. Instead of peak detector 203 and comparator 205 of FIG. 2, however, LOS detector 300 has inconsistency detector 303.

Inconsistency detector 303 comprises two decision circuits: a main decision circuit $306_{main}$ and an auxiliary decision circuit $306_{aux}$. Like decision circuit 106 of FIG. 1, each decision circuit in inconsistency detector 303 has a comparator 308 that generates a difference signal 310 based on input data signal 102 and a corresponding stable decision threshold signal. According to this embodiment of the present invention, decision threshold signal $304_{aux}$ applied to comparator 308 of auxiliary decision circuit $306_{aux}$ is greater than decision threshold signal $304_{main}$ applied to comparator 308 of main decision circuit $306_{main}$ by a stable offset voltage Δ. For example, if a logic "0" in the input data signal corresponds to a signal level of 0 volts and if a logic "1" corresponds to a signal level of 5 volts, then typical values of the main and auxiliary decision threshold signals would be 2.5 and 3.0 volts, respectively, with Δ=0.5V.

Within each decision circuit, difference signal 310 generated by comparator 308 is sampled by flip-flop 312 based on recovered clock signal 128 (i.e., from VCO 126 of FIG. 1) to generate a decision circuit output signal 314. The main and auxiliary decision circuit output signals $314_{main}$ and $314_{aux}$ are applied to XOR gate 317, which applies a logical "XOR" operation to generate a low inconsistency signal 319 whenever the two decision circuit output signals are mutually consistent (i.e., both high or both low) and a high inconsistency signal 319 whenever the two decision circuit output signal are mutually inconsistent (i.e., one high and one low). In a preferred implementation, an AND gate (not shown) is configured between XOR gate 317 and logic circuit 321, with the output from XOR gate 317 applied to one AND gate input, recovered clock signal 128 applied to the other AND gate input, and the AND gate output applied to the input to logic circuit 321. As such, a distinct inconsistency signal pulse will be applied to logic circuit 321 for each occurrence of inconsistency between the two decision circuit output signals.

With a pulsed inconsistency signal 319 applied, logic circuit 321 counts the number of occurrences of high inconsistency signal pulses from XOR gate 317 and determines whether the number of occurrences in a specified time period (e.g., about 1 microsecond) exceeds a specified threshold level N(e.g., about 50). If so, logic circuit 321 generates a high output signal 313 indicating that an LOS condition has been detected.

Inconsistency detector 303 is designed to detect (at least) the following different types of LOS conditions:

Input data switching synchronously with the local VCO at a low peak-to-peak amplitude (due to unintentional feedback); and Input data switching randomly with either high or low peak-to-peak amplitude.

Analogous to OR gate 213 of FIG. 2, OR gate 315 of FIG. 3 receives output signal 307 from transition detector 301 and output signal 313 from inconsistency detector 303 and generates LOS signal 136, which is high if either or both of output signals 307 and 313 are high, to indicate that an LOS condition has been detected.

Figure 4:
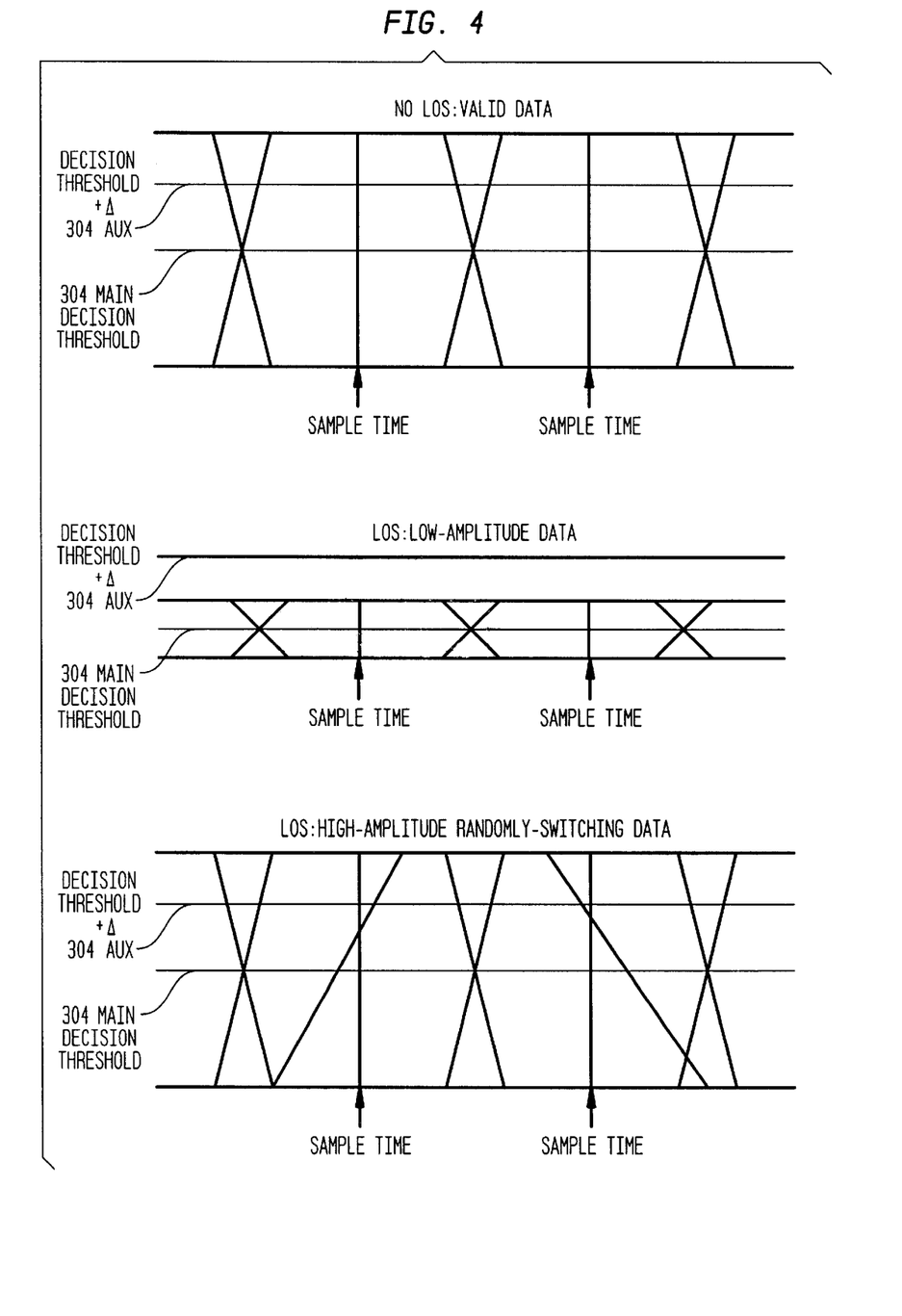
FIG. 4(A) shows a signal timing diagram corresponding to a valid input data signal (i.e. no LOS)
FIG. 4(B) shows a signal timing diagram corresponding to an LOS condition in which the input data switches synchronously with the local VCO at a low peak-to-peak amplitude (due to unintentional feedback) as may occur during some cut fiber situations.
FIG. 4(C) shows a signal timing diagram corresponding to an LOS condition in which the input data has a relatively high peak-to-peak amplitude and switches asynchronously.

FIG. 4(A) shows a signal timing diagram corresponding to a valid input data signal (i.e., no LOS). As shown in FIG. 4, at each sampling time (as dictated by recovered clock signal 128 from VCO 126 of FIG. 1), the input data will correspond to either a logic "0" or a logic "1". When the input data corresponds to a logic "0", the input data signal will be less than both the main and auxiliary decision threshold signals $304_{main}$ and $304_{aux}$. In that case, the output signals from both the main and auxiliary decision circuits $306_{main}$ and $306_{aux}$ will both be low, and the output from XOR circuit 317 will be low. Similarly, when the input data corresponds to a logic "1", the input data signal will be greater than both the main and auxiliary decision threshold signals $304_{main}$ and $304_{aux}$. In that case, the output signals from both the main and auxiliary decision circuits $306_{main}$ and $306_{aux}$ will both be high, and the output from XOR circuit 317 will again be low. Under these conditions, logic circuit 321 will rarely if ever increment its counter and the resulting output signal 313 will remain low indicating that inconsistency detector 303 has not detected an LOS condition.

FIG. 4(B) shows a signal timing diagram corresponding to an LOS condition in which the input data switches synchronously with the local VCO at a low peak-to-peak amplitude (due to unintentional feedback) as may occur during some cut fiber situations. In this case, at some sampling times, the input data signal level will be below both the main and auxiliary decision threshold signals $304_{main}$ and $304_{aux}$, in which case, the outputs from the main and auxiliary decision circuits will both be low, while, at other sampling times, the input data signal level will be greater than the main decision threshold signal $304_{main}$, but less than the auxiliary decision threshold signal $304_{aux}$. At those occasions, output signal $314_{main}$ from main decision circuit $306_{main}$ will be high, while output signal $314_{aux}$ from auxiliary decision circuit $306_{aux}$ will be low, resulting in a high inconsistency signal 319 being generated by XOR circuit 317. As a result, logic circuit 321 may eventually detect more than N occurrences of inconsistency over the specified time period, resulting in a high output signal 313, which will cause a high LOS signal 136 indicating the detection of an LOS condition. Note that situations in which the input data level always remains below or always remains above main decision threshold level $304_{main}$, will be detected as stuck-at-zero or stuck-at-one LOS conditions, respectively, by transition detector 301 of LOS detector 300.

FIG. 4(C) shows a signal timing diagram corresponding to an LOS condition in which the input data has a relatively high peak-to-peak amplitude and switches randomly (or at least asynchronously with respect to recovered clock signal 128). This is an LOS condition that will not be detected reliably (or even at all) by conventional LOS detector 200 of FIG. 2, because the peak-to-peak amplitude is large enough to keep the output of comparator 205 low. Because the input data signal level switches asynchronously with respect to the recovered clock signal, at certain sampling times, the sampled input data signal will be higher than both the main and auxiliary decision thresholds $304_{main}$ and $304_{aux}$. At other sampling times, the sampled input data signal will be lower than both the main and auxiliary decision thresholds, and, at still other sampling times, the sampled input data signal will be higher than the main decision threshold, but lower than the auxiliary decision threshold (e.g., when the sampling occurs during a data transition). As a result, there will be times when the two decision circuit output signals $314_{main}$ and $314_{aux}$ will be mutually consistent (i.e., both high or both low) and other times when the two decision circuit output signals will be mutually inconsistent (i.e., one high and one low). As such, XOR gate 317 will generate pulses indicating occurrences of inconsistency, and logic circuit 321 may eventually accumulate more than N occurrences of inconsistency in the specified time period and generate a high output signal (resulting in a high LOS signal at OR gate 315) indicating the detection of an LOS condition.

Those skilled in the art will understand that inconsistency detector 303 of FIG. 3 detects whether or not the data "eye" is open in the vertical (i.e., amplitude) axis.

In a preferred shared-circuitry implementation of LOS detector 300, decision circuit 106 of FIG. 1 functions as the main decision circuit for inconsistency detector 303 as well as the decision circuit for CDR circuit 100. Such a shared-circuitry implementation is suggested by FIG. 3, which shows output signal $314_{main}$ from main decision circuit $306_{main}$ being provided as recovered data signal 114 of FIG. 1, in addition to being forwarded to XOR gate 317.

Figure 5:
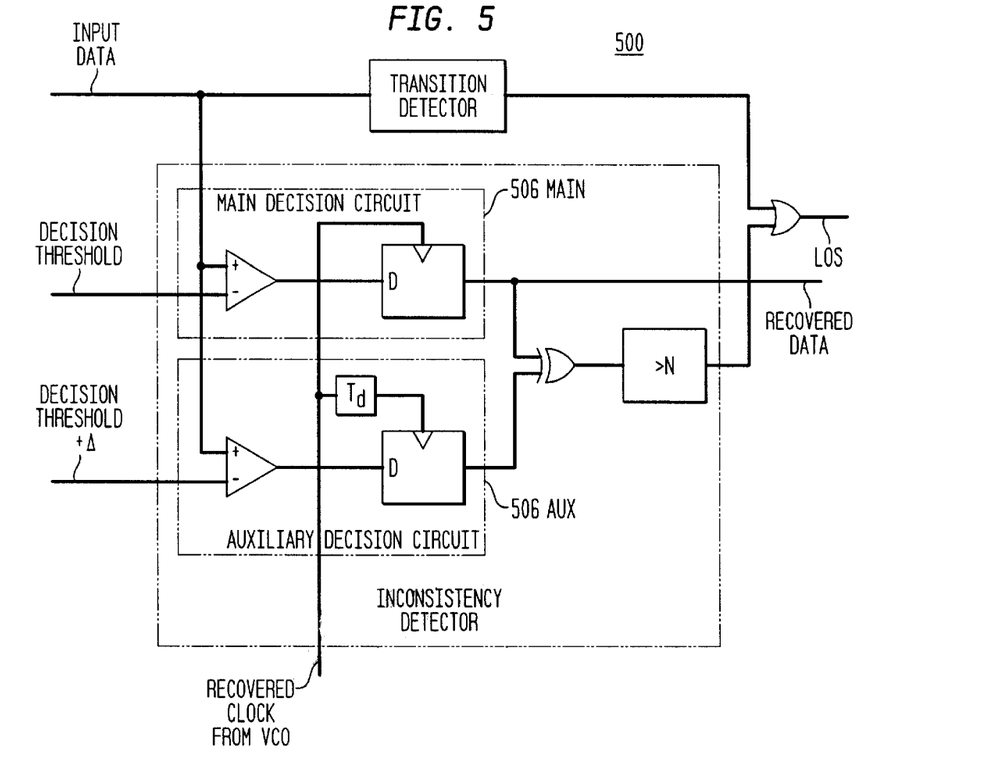
FIG. 5 shows a block diagram of an LOS detector, according to an alternative embodiment of the present invention, for use in the CDR circuit of FIG. 1.

FIG. 5 shows a block diagram of an LOS detector 500, according to an alternative embodiment of the present invention, for use in CDR circuit 100 of FIG. 1. According to this embodiment, the timing of the sampling implemented by the flip-flop in auxiliary decision circuit $506_{aux}$ is delayed by a specified time delay $T_d$ relative to the timing of the sampling implemented by the flip-flop in main decision circuit $506_{main}$.

Figure 6:
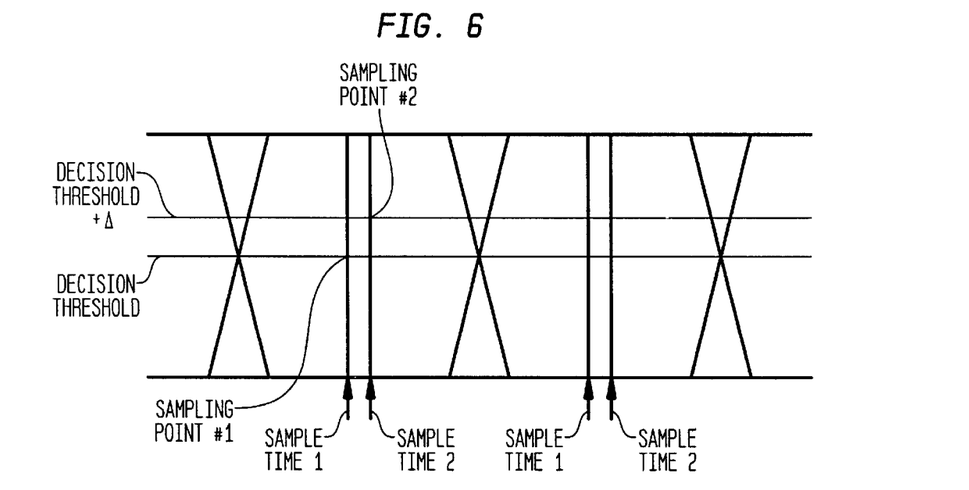
FIG. 6 shows a signal timing diagram for the LOS detector of FIG. 5.

FIG. 6 shows a signal timing diagram for LOS detector 500 of FIG. 5. As indicated in FIG. 6, main decision circuit $506_{main}$ operates at sampling point #1, while auxiliary decision circuit $506_{aux}$ operates at sampling point #2, where the different sampling points indicate that the inconsistency detector slices the data at two different levels and samples it at two different points in time. As such, those skilled in the art will understand that the inconsistency detector of FIG. 5 detects whether or not the data "eye" is open in both the vertical (i.e., amplitude) axis and the horizontal (i.e., time) axis.

Figure 7:
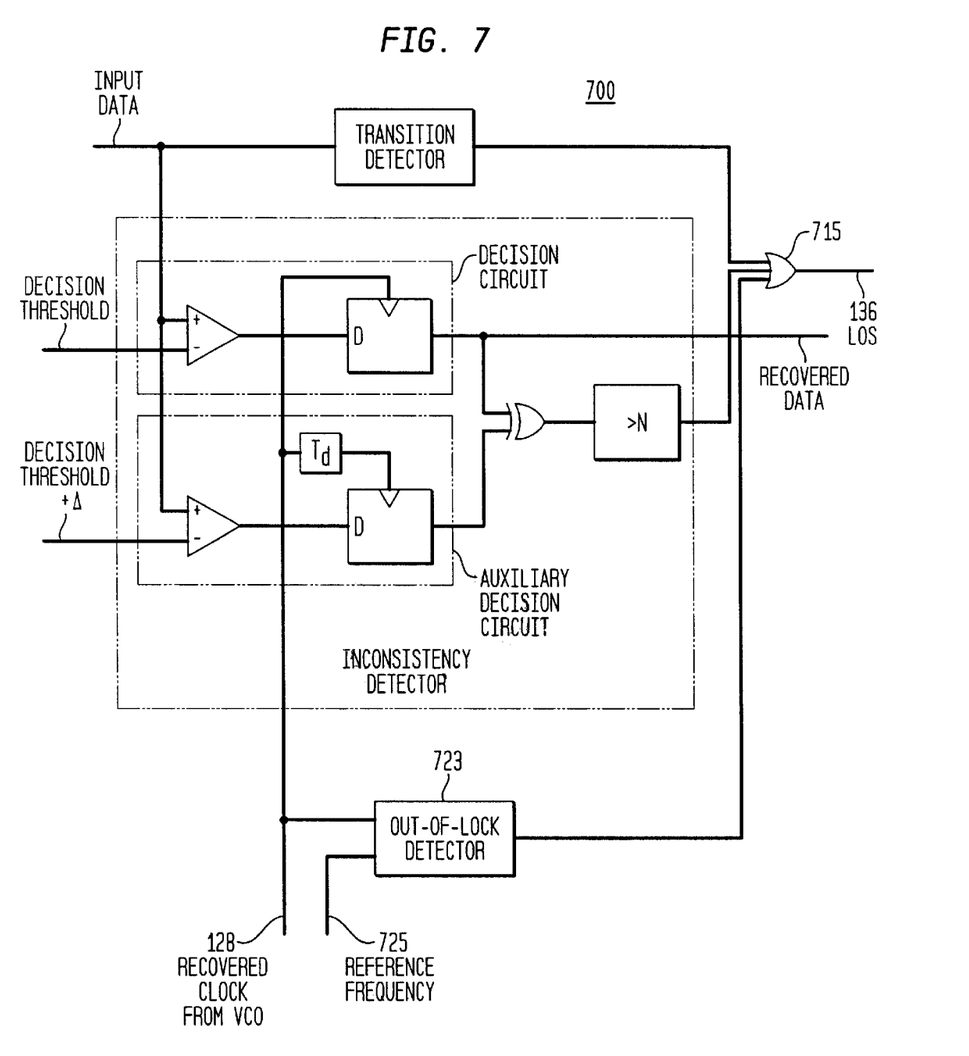
FIG. 7 shows a block diagram of an LOS detector, according to another alternative embodiment of the present invention, for use in the CDR circuit of FIG. 1.

FIG. 7 shows a block diagram of a loss-of-signal detector 700, according to another alternative embodiment of the present invention, for use in CDR circuit 100 of FIG. 1. According to this embodiment, in addition to the circuitry of LOS detector 500 of FIG. 5, LOS detector 700 has an out-of-lock detector 723 which operates in parallel with the transition and inconsistency detectors to provide a third input to OR gate 715 to be used to generate LOS signal 136, where out-of-lock detector 723 generates a high output signal when the frequency of the recovered clock signal 128 from VCO 126 of FIG. 1 differs sufficiently from a stable reference frequency 725 or the data rate of the input data signal. If the VCO is declared to be out-of-lock, then an LOS condition will be declared. A preferred implementation of out-of-lock detector 723 is described in Messerschmitt, David G., "Frequency Detectors for PLL Acquisition in Timing and Carrier Recovery," *IEEE Trans. Comm.*, vol. COM-27, pp. 1288-1295, September 1979, the teachings of which are incorporated herein by reference.

Although the present invention has been described in the context of (1) a positive offset value Δ being added to the main decision threshold signal to form the auxiliary decision threshold signal and (2) a positive time delay $T_d$ being added to the recovered clock signal to determine when samples are to be taken by the flip-flop in the auxiliary decision circuit, those skilled in the art will understand that positive or negative offset values could be applied to either the auxiliary or the main decision threshold signal and that positive or negative time delays could be applied to the flip-flop in either the auxiliary or the main decision circuit. In preferred shared-circuitry implementations in which the decision circuit of the CDR circuit functions as the main decision circuit of the inconsistency detector, the offset and any time delay are preferably applied in the auxiliary decision circuit.

Although the present invention has been described in the context of inconsistency detectors having (1) an XOR gate to generate inconsistency signals from two different decision circuit output signals and (2) a logic circuit to determine whether the number of occurrences of mutually inconsistent decision circuit output signals exceeds a specified threshold value within a specified time period, those skilled in the art will understand that inconsistency detectors could be implemented with other hardware and/or software configurations that achieve that same general functionality.

Although the present invention has been described in the context of an inconsistency detector having two decision circuits, those skilled in the art will understand that inconsistency detectors could be implemented with more than two decision circuits. Moreover, the present invention has been described in the context of inconsistency detectors, in which the two decision circuits apply different decision threshold signals either at the same time (as in FIG. 3) or at different times (as in FIGS. 5 and 7). Those skilled in the art will understand that, in other embodiments, the two decision circuits could apply the same decision threshold signal at different times. This opens up the possibility of implementing an inconsistency detector with a single decision circuit that samples the input data signal at two different times within each clock sampling period, where each pair of samples is compared to generate the inconsistency signal input to the counter logic. In a shared-circuitry implementation, the CDR circuit could be implemented with a single decision circuit that functions as both the CDR decision circuit as well as the decision circuit in the inconsistency detector in the LOS detector.

While the exemplary embodiments of the present invention have been described with respect to processes of circuits, including possible implementation as a single integrated circuit, the present invention is not so limited. As would be apparent to one skilled in the art, various functions of circuit elements may also be implemented as processing steps in a software program. Such software may be employed in, for example, a digital signal processor, microcontroller or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A loss-of-signal (LOS) detector for a clock/data recovery (CDR) circuit configured to (1) generate a recovered clock signal from an input data signal, (2) sample the input data signal with a CDR decision circuit based on the recovered clock signal, and (3) compare the sampled input data signal to a CDR decision threshold to generate a recovered data signal, the LOS detector comprising:
   (a) a transition detector connected to receive the input data signal and configured to detect a stuck-at-one or a stuck-at-zero LOS condition in the input data signal; and
   (b) an inconsistency detector connected to receive the input data signal and configured to detect an LOS condition in which the input data signal switches asynchronously with respect to the recovered clock signal, wherein the inconsistency detector operates independent of any measure of peak-to-peak amplitude of the input data signal.

2. The invention of claim 1, wherein the CDR circuit and the LOS detector are implemented in a single integrated circuit.

3. The invention of claim 1, further comprising an OR gate configured to apply a logical "OR" operation to output signals from the transition detector and the inconsistency detector to generate an LOS signal for the LOS detector.

4. The invention of claim 1, wherein the inconsistency detector comprises:
   (1) a main decision circuit configured to generate a main decision circuit output signal based upon the input data signal and a main decision threshold signal;
   (2) an auxiliary decision circuit configured to generate an auxiliary decision circuit output signal based upon the input data signal and an auxiliary decision threshold signal, wherein the main and auxiliary decision threshold signals differ from one another by a specified offset value;
   (3) an XOR gate configured to apply a logical "XOR" operation to the main and auxiliary decision circuit output signals to generate an inconsistency signal that indicates whether or not the main and auxiliary decision circuit output signals are mutually inconsistent; and (4) a logic circuit connected to receive the inconsistency signal and configured to detect when a number of occurrences of inconsistency between the main and auxiliary decision circuit output signals exceeds a specified threshold value over a specified period of time to generate an output signal from the inconsistency detector.

5. The invention of claim 4, wherein each of the main and auxiliary decision circuits comprises:

(i) a comparator configured to generate a difference signal based on the input data signal and the corresponding decision threshold signal; and (ii) a flip-flop configured to sample the difference signal at sampling times based on the recovered clock signal.

6. The invention of claim 5, wherein the sampling times of the flip-flop in the auxiliary decision circuit differ from the sampling times of the flip-flop in the main decision circuit by a specified time delay.

7. The invention of claim 4, wherein the CDR circuit is implemented using shared circuitry in which the CDR decision circuit functions as the main decision circuit in the inconsistency detector of the LOS detector.

8. The invention of claim 1, further comprising an out-of-lock detector connected to receive the recovered clock signal and configured to compare the recovered clock signal with at least one of (i) a reference clock frequency and (ii) a detected input data rate to detect an LOS condition in which the recovered clock signal is out-of-lock.

9. The invention of claim 1, wherein the inconsistency detector comprises:

(1) a decision circuit configured to generate at least two decision circuit output signals based upon the input data signal and a single decision threshold signal, wherein the two decision circuit output signals are sampled at different times within each sampling period of the recovered clock signal;

(2) an XOR gate configured to apply a logical "XOR" operation to the two decision circuit output signals to generate an inconsistency signal that indicates whether or not the two decision circuit output signals are mutually inconsistent; and (3) a logic circuit configured to detect when a number of occurrences of inconsistency between the two decision circuit output signals exceeds a specified threshold value over a specified period of time to generate an output signal from the inconsistency detector.

10. The invention of claim 9, wherein the decision circuit comprises:

(i) a comparator configured to generate a difference signal based on the input data signal and the single decision threshold signal; and (ii) a flip-flop configured to sample the difference signal at sampling times based on the recovered clock signal.

11. The invention of claim 9, wherein the CDR circuit is implemented using shared-circuitry in which the CDR decision circuit functions as the decision circuit in the inconsistency detector of the LOS detector.

12. A method for detecting a loss-of-signal (LOS) condition in a clock/data recovery (CDR) circuit configured to (1) generate a recovered clock signal from an input data signal, (2) sample the input data signal with a CDR decision circuit based on the recovered clock signal, and (3) compare the sampled input data signal to a CDR decision threshold to generate a recovered data signal, the method comprising the steps of:

(a) processing the input data signal to detect a stuck-at-one or a stuck-at-zero LOS condition; and (b) processing the input data signal to detect an LOS condition in which the input data signal switches asynchronously with respect to the recovered clock signal, wherein the inconsistency detector operates independent of any measure of peak-to-peak amplitude of the input data signal.

13. The invention of claim 12, further comprising of applying a logical "OR" operation to results of steps (a) and (b) to determine whether an LOS condition exists.

14. The invention of claim 12, wherein step (b) comprises the steps of:

(1) generating a main decision output signal based upon the input data signal and a main decision threshold signal;

(2) generating an auxiliary decision output signal based upon the input data signal and an auxiliary decision threshold signal, wherein the main and auxiliary decision threshold signals differ from one another by a specified offset value;

(3) applying a logical "XOR" operation to the main and auxiliary decision output signals to generate an inconsistency signal that indicates whether or not the main and auxiliary decision output signals are mutually inconsistent; and (4) detecting when a number of occurrences of inconsistency between the main and auxiliary decision output signals exceeds a specified threshold value over a specified period of time to detect the LOS condition of step (b).

15. The invention of claim 14, wherein each of steps (b)(1) and (b)(2) comprises the steps of:

(i) generating a difference signal based on the input data signal and the corresponding decision threshold signal; and (ii) sampling the difference signal at sampling times based on the recovered clock signal.

16. The invention of claim 15, wherein the sampling times for step (b)(1)(ii) differ from the sampling times for step (b)(2)(ii) by a specified time delay.

17. The invention of claim 14, wherein the CDR circuit is implemented using shared circuitry in which the CDR decision circuit implements step (b)(1).

18. The invention of claim 12, further comprising the step of comparing the recovered clock signal with a reference clock frequency or a detected input data rate to detect an LOS condition in which the recovered clock signal is out-of-lock.

19. The invention of claim 12, wherein step (b) comprises the steps of:

(1) generating at least two decision output signals based upon the input data signal and a single decision threshold signal, wherein the two decision output signals are sampled at different times within each sampling period of the recovered clock signal;

(2) applying a logical "XOR" operation to the two decision output signals to generate an inconsistency signal that indicates whether or not the two decision output signals are mutually inconsistent; and (3) detecting when a number of occurrences of inconsistency between the two decision output signals exceeds a specified threshold value over a specified period of time to detect the LOS condition of step (b).

20. The invention of claim 19, wherein step (b)(1) comprises the steps of:
  (i) generating a difference signal based on the input data signal and the single decision threshold signal; and
  (ii) sampling the difference signal at sampling times based on the recovered clock signal.

21. The invention of claim 19, wherein the CDR circuit is implemented using shared-circuitry in which the CDR decision circuit implements step (b)(1).

22. A machine-readable medium, having encoded thereon program code, wherein, when the program code is executed by a machine, the machine implements a method for detecting a loss-of-signal (LOS) condition in a clock/data recovery (CDR) circuit configured to (1) generate a recovered clock signal from an input data signal, (2) sample the input data signal with a CDR decision circuit based on the recovered clock signal, and (3) compare the sampled input data signal to a CDR decision threshold to generate a recovered data signal, the method comprising the steps of:
  (a) processing the input data signal to detect a stuck-at-one or a stuck-at-zero LOS condition; and
  (b) processing the input data signal to detect an LOS condition in which the input data signal switches asynchronously with respect to the recovered clock signal, wherein the inconsistency detector operates independent of any measure of peak-to-peak amplitude of the input data signal.

23. A loss-of-signal (LOS) detector for a clock/data recovery (CDR) circuit configured to (1) generate a recovered clock signal from an input data signal, (2) sample the input data signal with a CDR decision circuit based on the recovered clock signal, and (3) compare the sampled input data signal to a CDR decision threshold to generate a recovered data signal, the LOS detector comprising:
  (a) a transition detector connected to receive the input data signal and configured to detect a stuck-at-one or a stuck-at-zero LOS condition in the input data signal; and
  (b) an inconsistency detector connected to receive the input data signal and configured to detect an LOS condition in which the input data signal switches asynchronously with respect to the recovered clock signal, wherein the inconsistency detector comprises:
    (1) a main decision circuit configured to generate a main decision circuit output signal based upon the input data signal and a main decision threshold signal;
    (2) an auxiliary decision circuit configured to generate an auxiliary decision circuit output signal based upon the input data signal and an auxiliary decision threshold signal, wherein the main and auxiliary decision threshold signals differ from one another by a specified offset value;
    (3) an XOR gate configured to apply a logical "XOR" operation to the main and auxiliary decision circuit output signals to generate an inconsistency signal that indicates whether or not the main and auxiliary decision circuit output signals are mutually inconsistent; and
    (4) a logic circuit connected to receive the inconsistency signal and configured to detect when a number of occurrences of inconsistency between the main and auxiliary decision circuit output signals exceeds a specified threshold value over a specified period of time to generate an output signal from the inconsistency detector.

24. A loss-of-signal (LOS) detector for a clock/data recovery (CDR) circuit configured to (1) generate a recovered clock signal from an input data signal, (2) sample the input data signal with a CDR decision circuit based on the recovered clock signal, and (3) compare the sampled input data signal to a CDR decision threshold to generate a recovered data signal, the LOS detector comprising:
  (a) a transition detector connected to receive the input data signal and configured to detect a stuck-at-one or a stuck-at-zero LOS condition in the input data signal; and
  (b) an inconsistency detector connected to receive the input data signal and configured to detect an LOS condition in which the input data signal switches asynchronously with respect to the recovered clock signal, wherein the inconsistency detector comprises:
    (1) a decision circuit configured to generate at least two decision circuit output signals based upon the input data signal and a single decision threshold signal, wherein the two decision circuit output signals are sampled at different times within each sampling period of the recovered clock signal;
    (2) an XOR gate configured to apply a logical "XOR" operation to the two decision circuit output signals to generate an inconsistency signal that indicates whether or not the two decision circuit output signals are mutually inconsistent; and
    (3) a logic circuit configured to detect when a number of occurrences of inconsistency between the two decision circuit output signals exceeds a specified threshold value over a specified period of time to generate an output signal from the inconsistency detector.

* * * * *